(12) United States Patent
Morand

(10) Patent No.: US 8,710,598 B2
(45) Date of Patent: Apr. 29, 2014

(54) HIGH-DENSITY 3-DIMENSIONAL STRUCTURE

(75) Inventor: Jean-Luc Morand, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 1037 days.

(21) Appl. No.: 12/552,032

(22) Filed: Sep. 1, 2009

(65) Prior Publication Data

US 2010/0055507 A1 Mar. 4, 2010

(30) Foreign Application Priority Data

Sep. 3, 2008 (FR) ..................................... 08 55906

(51) Int. Cl.
*H01L 29/82* (2006.01)
(52) U.S. Cl.
USPC .......................................... 257/415; 257/419
(58) Field of Classification Search
USPC ................................................. 257/415, 419
See application file for complete search history.

(56) References Cited

U.S. PATENT DOCUMENTS 3,962,713 A 6/1976 Kendall et al.

FOREIGN PATENT DOCUMENTS

DE 20 2007 003 877 8/2007

OTHER PUBLICATIONS

French Search Report, dated May 14, 2009, from corresponding French Patent Application No. 08/55906.
Hong et al: "Conjugate Heat Transfer in Fractal-Shaped Microchannel Network Heat Sink for Integrated Microelectronic Cooling Application" International Journal of Heat and Mass Transfer, Pergamon Press, GB,, vol. 50, No. 25-26, Nov. 5, 2007, pp. 4986-4998, XP022371447.
Hirad Samavati et al: "Fractal Capacitors", IEEE Journal of Solid-State Circuits, IEEE Service Center, Piscatanay, NJ, US, vol. 33, No. 12, Dec. 1, 1998, pp. 2035-2041 XPO11060899 ISSN: 0018-9200.

*Primary Examiner* — Samuel Gebremariam
(74) *Attorney, Agent, or Firm* — Wolf, Greenfield & Sacks, P.C.

(57) ABSTRACT

A 3-D structure formed in a recess of a substrate delimited by walls, including a large number of rectangle parallelepipedic blades extending from the bottom of the recess to the substrate surface while being oriented perpendicularly to one another and formed in a pattern covering the whole surface of the recess, some blades being non-secant to one of the walls, each non-secant blade being connected to one of the walls by at least another perpendicular blade.

27 Claims, 3 Drawing Sheets

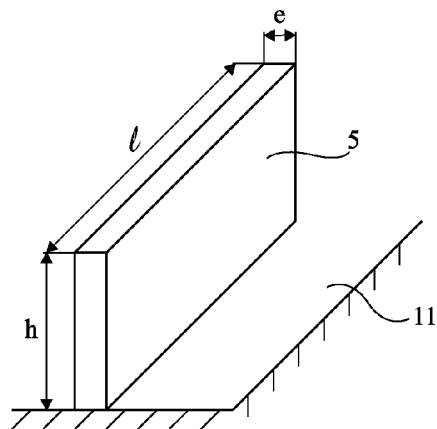
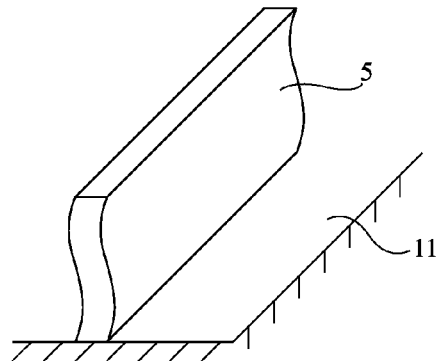
Fig 3A    Fig 3B
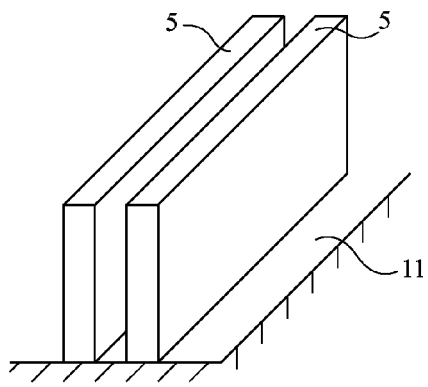
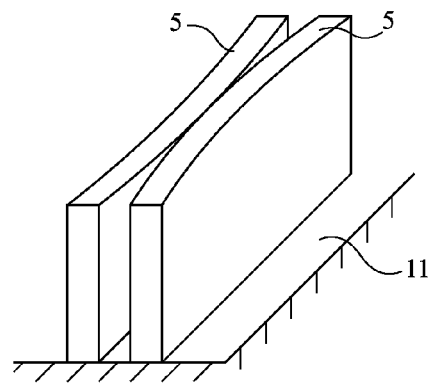
Fig 4A    Fig 4B
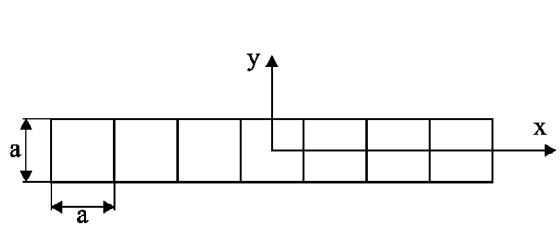
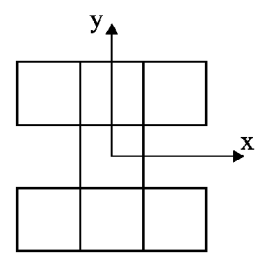
Fig 5A    Fig 5B

HIGH-DENSITY 3-DIMENSIONAL STRUCTURE

CROSS REFERENCE TO RELATED APPLICATIONS

This application claims the priority benefit of French patent application number 08/55906, filed on Sep. 3, 2008, entitled "HIGH-DENSITY 3-DIMENSIONAL STRUCTURE," which is hereby incorporated by reference to the maximum extent allowable by law.

BACKGROUND OF THE INVENTION

1. Field of the Invention

The present invention relates to 3-dimensional structures and, more specifically, to supports for such structures. The present invention relates to structures having at least one dimension on the order of one micrometer, or even of a few tenths of a micrometer or less.

2. Discussion of the Related Art

To form 3-D structures, a method comprises using a substrate, for example, made of silicon, in which a great number of very narrow trenches, close to one another, for example at a step on the order of one micrometer, separated by thin silicon blades, are formed. Micro-electro-mechanical devices (MEMS) are thus for example formed. Various layers may also be arranged on the walls and bottom of these trenches to form electronic components. Fuel cell cores or cells forming micro-batteries may also be formed on the walls and the bottom of these trenches.

In the case of electronic components, capacitors or diodes having their active areas extending on the walls and bottom of the trenches are for example formed. Thus, capacitors having very high capacitances per surface unit are obtained.

FIG. 1 illustrates an example of a support for 3-D components. The support is formed of a substrate 1, for example, made of silicon, in which trenches 3 are formed. Trenches 3 have a significantly elongated rectangular shape, at the substrate surface. The trenches extend parallel to one another. Thus, each trench 3 is separated from another trench by a silicon blade 4.

FIG. 2 illustrates a partial cross-section view of a capacitor formed on a support such as that in FIG. 1. In FIG. 2, only two trenches 3 are shown.

A stack of a first conductive layer 6 and of an insulating layer 7 extends on the surface of substrate 1 and on the walls and bottom of trenches 3. A second conductive layer 9 fills the space remaining in trenches 3 and extends, above the substrate, on insulating layer 7. Conductive layers 6 and 9 form the two capacitor electrodes. Contacts, not shown, are taken in appropriate fashion on each of these electrodes.

The capacitance of the capacitor of FIG. 2 is linked to the facing surface between each of electrodes 5 and 9, and to the thickness of insulating layer 7. A recurrent object in the forming of 3-D capacitors is to increase their capacitances without increasing the surface area that they take up at the substrate surface. The facing surface between electrodes is thus desired to be increased. For this purpose, it is desirable to increase height h and to decrease thickness e of the blades between trenches to form more trenches per area unit.

However, when it is dug too deeply or when very close trenches are formed, mechanical stress that may deform the blades and the trenches appears on each of the blades separating the trenches. This limits the increase of the ratio of the trench depth to the blade thickness.

SUMMARY OF THE INVENTION

At least one embodiment of the present invention aims at supports for 3-D structures having a significant integration density, likely to comprise high and thin blades.

At least one embodiment of the present invention also aims at any type of mechanical, electronic or other component, formed on such a support.

Thus, to achieve all or part of these objects as well as others, an embodiment of the present invention provides a 3-D structure formed in a recess of a substrate delimited by walls, comprising a large number of parallelepipedic blades extending from the bottom of the recess to the substrate surface while being oriented perpendicularly to one another and formed in a pattern covering the whole surface of said recess, some blades being non-secant to one of the walls, each non-secant blade being connected to one of the walls by at least another perpendicular blade.

According to an embodiment of the present invention, the trenches separating the blades altogether form, at the substrate surface, a pattern following a Moore fractal curve.

According to an embodiment of the present invention, the recess has a depth, in the substrate, which is greater than 100 μm.

According to an embodiment of the present invention, the blades have a thickness smaller than 0.8 μm and are separated from one another by a distance shorter than 0.8 μm.

According to an embodiment of the present invention, the substrate and the blades are made of silicon.

An embodiment of the present invention further provides a device comprising a structure such as described hereabove on the relief of which extends a capacitor, a diode, a fuel cell, or a micro-battery.

The foregoing objects, features, and advantages of the present invention will be discussed in detail in the following non-limiting description of specific embodiments in connection with the accompanying drawings.

BRIEF DESCRIPTION OF THE DRAWINGS

FIGS. 3A and 3B illustrate the effect of buckling phenomena on a silicon blade;

FIGS. 4A and 4B illustrate the effect of the electrostatic forces between two silicon blades;

FIGS. 5A and 5B illustrate, in top view, two patterns likely to be submitted to mechanical deflections;

DETAILED DESCRIPTION

Figure 1:
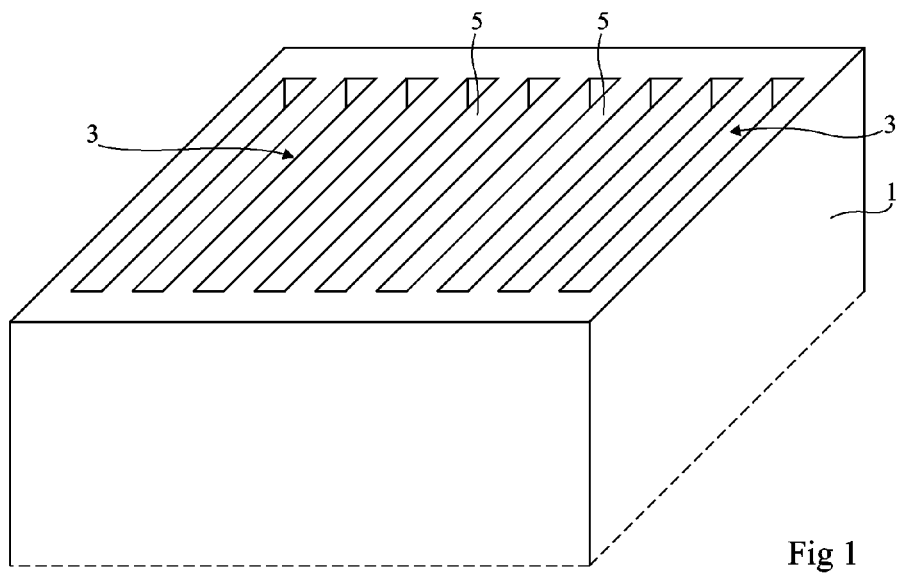
FIG. 1, previously described, illustrates an example of a known 3-D component support.
Figure 2:
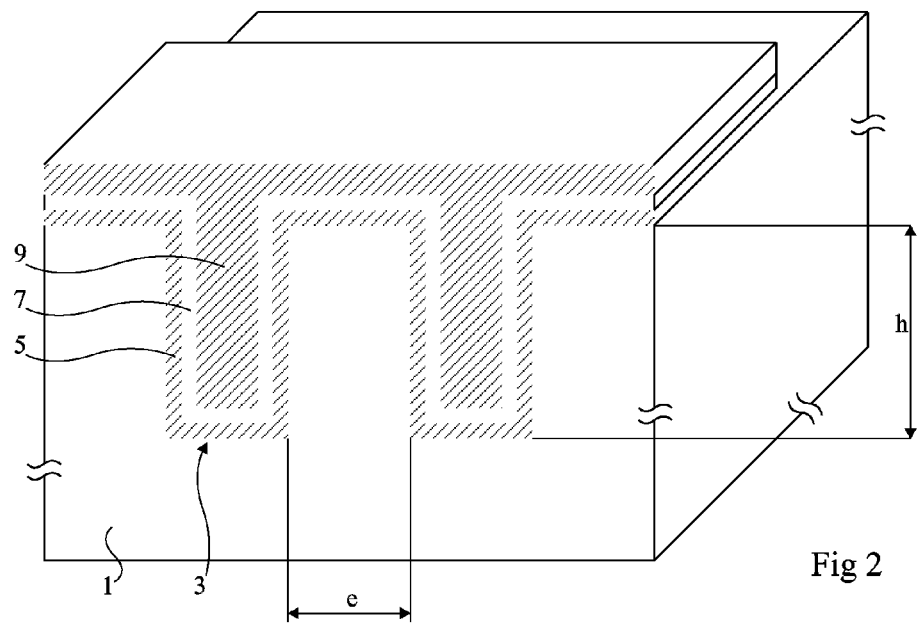
FIG. 2, previously described, illustrates an example of a capacitor formed on a support such as that in FIG. 1.

For clarity, the same elements have been designated with the same reference numerals in the different drawings and, further, the various drawings are not to scale.

FIGS. 3A, 3B, 4A, and 4B illustrate the effects of two mechanical stresses which appear on blades when the latter have a significant height or a low thickness. More specifically, FIGS. 3A and 3B illustrate the deformations due to buckling and FIGS. 4A and 4B illustrate the deformations due to electrostatic forces between blades.

FIG. 3A illustrates an isolated blade 5 extending vertically from a plane 11. Blade 5 has a height h, a thickness e, and a length l.

When height h of the blade is large and its thickness e is small, a buckling phenomenon may occur due to the weight of the blade. This results in the deformation of the blade, as illustrated in FIG. 3B: the blade settles on itself, its height h decreases, and it substantially forms an S or a C in cross-section.

FIG. 4A illustrates two parallel blades 5, of the same type as that in FIG. 3A. FIG. 4B illustrates the deformation of the blades of FIG. 4A due to the electrostatic forces between the blades. The base of blades 5 being attached to support 11, the electrostatic forces bring the facing walls of the two blades closer to each other, or even against each other, as shown in FIG. 4B.

The forming of blades of significant height h and of small thickness e increases the risks of deformation of such blades by the effects mentioned hereabove. Thus, parasitic mechanical and electrostatic phenomena limit dimensional selection possibilities.

It is provided to form a support comprising blades having a shape such that buckling phenomena and deformations due to electrostatic forces are attenuated. For this purpose, the inventor provides forming, in the support, sets of blades. Each set comprises an assembly of orthogonal blades, with at least one of them that joins a wall of a recess in which the blade sets are formed. Thus, portions which are substantially I-shaped, in top view, can be defined in each assembly.

In an I-shaped portion comprising a center bar and two parallel end branches, blades forming the parallel branches of the I enable the holding of the blade forming the central bar thereof. The stiffness of a blade assembly, like any mechanical structure, is characterized by its moment of area. Said moment is particularly high in the case of I-shaped portions.

FIG. 5A shows an example of a blade formed of seven elementary squares of side length a, extending along an axis x. The perimeter of this blade thus is 16a. FIG. 5B illustrates a blade assembly forming an I, also comprising seven elementary squares of side length a. This assembly also has a perimeter equal to 16a. Thus, the surface of layers formed on the blade walls will be the same in the case of FIGS. 5A and 5B. In FIG. 5B, an axis y follows the direction of the central bar of the I and an axis x is perpendicular to axis y. Theory shows that the moment of area along axis x of the blade of FIG. 5A is approximately 11 times smaller than the moment of area along axis x of the I shape of FIG. 5B and approximately 10 times smaller than the moment of area along axis y of this last pattern. This difference in moment of areas explains the difference in stiffness between the patterns of FIGS. 5A and 5B.

To further increase the resistance of the blade assemblies against mechanical and electrostatic phenomena, the present invention provides for each blade assembly to comprise at least one blade which is directly connected to a wall of a recess in which the different blade assemblies are formed. It will be within the abilities of those skilled in the art to form such a structure comprising assemblies of blades perpendicular to one another, each assembly comprising at least one blade connected to a wall of the recess.

Among the different possible configurations, the inventor provides forming trenches having a shape, in top view, substantially following a Moore fractal curve. Such a fractal curve has the advantage of naturally fitting into a square, which is particularly appropriate for the geometry of electronic chips, and of being able to be easily computer-modeled.

Figure 6:
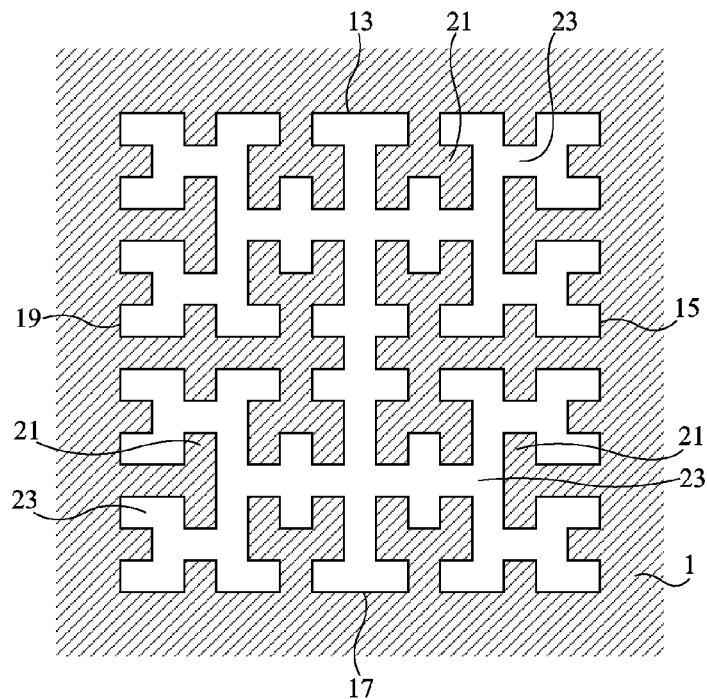
FIG. 6 is a top view of a support according to an embodiment of the present invention.

FIG. 6 is a top view of a support according to such an embodiment, the support being for example made of silicon. Support 1 comprises a recess delimited by walls 13, 15, 17, and 19. Blades 21 extending from the bottom of the recess surround trenches 23, trenches 23 altogether forming a pattern following a Moore curve of order 4. Each blade 21 is either directly connected to one of walls 13, 15, 17, or 19, or indirectly connected to one of these walls via one or several blades 21 perpendicular to the first blade. A stiff structure is thus obtained, each blade enabling an efficient holding of the surrounding blades.

Figure 7:
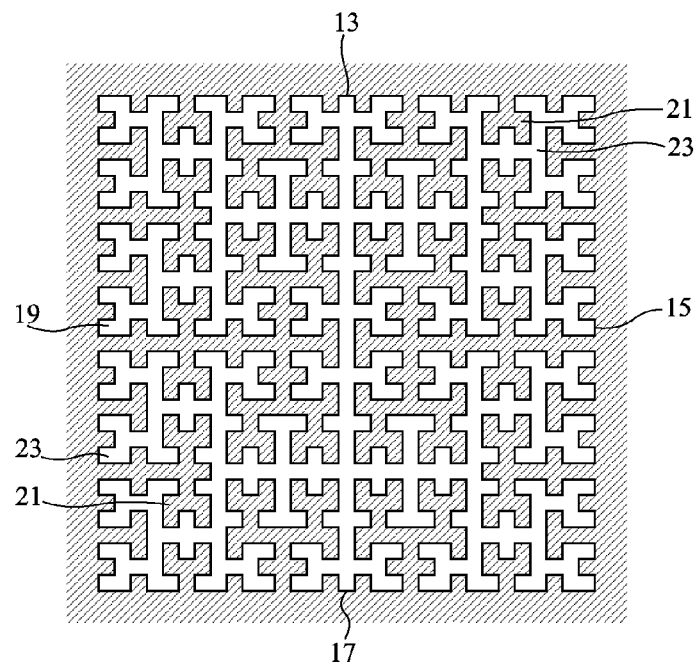
FIG. 7 is a top view of another support according to an embodiment of the present invention.

FIG. 7 illustrates a variation of FIG. 6 in which trenches 23 follow a Moore curve of order 5.

Advantageously, for a same substrate surface and blades of same thicknesses, a structure such as that in FIG. 6 has a mechanical resistance from 5 to 10 times greater than that of a structure such as in FIG. 1. Thus, trenches having a height which is at least 5 times greater than before can be formed, without risking to adversely affect the structure stiffness. The blades may have a thickness much smaller than one micrometer, for example, 0.8 µm, or even smaller than one tenth of a micrometer, for a height greater than 100 µm, and be separated by a distance smaller than one micrometer, for example 0.8 µm, or even smaller than one tenth of a micrometer. In the case of capacitors, capacitors having capacitances at least 5 times as large as previously are obtained. The inventor expects to obtain capacitors having a capacitance per area unit greater than approximately 250 nF/mm$^2$.

It should be noted that the embodiments of FIGS. 6 and 7 are examples only, and that any pattern comprising blades, which by their assembly substantially form I portions and where each assembly comprises at least one blade directly connected to a wall of the support, will also be suitable.

Rounded versions of the Moore curves with no sharp angle may also be used to ease the implementation. This is similar to IPN-type shapes (normal girder profile), which have the specificity of a good resistance to out-of-line efforts. Such structures are formed based on an I, where the end branches of the I are widened at the level of its central bar. Such structures enable to further increase the mechanical resistance of patterns formed on a silicon substrate.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A 3-D structure formed in a recess of a substrate delimited by walls, comprising parallelepipedic thin blades extending from the bottom of the recess to the substrate surface, wherein the blades are oriented perpendicularly to one another and formed in a pattern covering the whole surface of said recess, wherein some blades are non-secant to one of the walls, wherein each non-secant blade is connected to one of the walls by at least another perpendicular blade, wherein the blades have at least one cross-sectional thickness perpendicular to a surface of the blade that is the same thickness for each blade.

2. The structure of claim 1, wherein trenches separating the blades form a pattern following a Moore fractal curve.

3. The structure of claim 2, wherein the Moore fractal curve comprises a Moore fractal curve of order 4.

4. The structure of claim 1, wherein the recess has a depth, in the substrate, which is greater than 100 µm.

5. The structure of claim 1, wherein the blades have a thickness smaller than 0.8 µm.

6. The structure of claim 5, wherein the blades are separated from one another by a distance shorter than 0.8 µm.

7. The structure of claim 1, wherein the substrate and the blades are made of silicon.

8. The structure of claim 1, wherein a capacitor, a diode, a fuel cell, or a micro-battery is formed on surfaces of the blades.

9. The structure of claim 1, wherein a capacitor is formed on surfaces of the blades having a capacitance per unit area greater than 250 nF/mm2.

10. The structure of claim 1, wherein a portion of the trench extends linearly and fully between two opposing walls.

11. A structure comprising:
a substrate;
a recess in the substrate surface;
sets of thin blades formed in the recess, wherein the sets of thin blades form a pattern covering the whole surface of the recess; and
each set of thin blades comprises an assembly of orthogonal thin blades with at least one thin blade joined to a wall of the recess, and wherein trenches separating the blades form a pattern following a Moore fractal curve.

12. The structure of claim 11, wherein each thin blade is a parallelepiped that extends from the bottom of the recess to the substrate surface.

13. The structure of claim 12, wherein the Moore fractal curve comprises a Moore fractal curve of order 4.

14. The structure of claim 11, wherein the recess has a depth, in the substrate, greater than 100 µm.

15. The structure of claim 11, wherein the blades have a thickness smaller than 0.8 µm.

16. The structure of claim 15, wherein the blades are separated from one another by a distance shorter than 0.8 µm.

17. The structure of claim 11, wherein the substrate and the blades are made of silicon.

18. The structure of claim 11, wherein a capacitor, a diode, a fuel cell, or a micro-battery is formed on the surfaces of the blades.

19. The structure of claim 11, wherein a capacitor is formed on surfaces of the blades having a capacitance per unit area greater than 250 nF/mm2.

20. The structure of claim 11, wherein a portion of the trench extends linearly and fully between two opposing walls.

21. A structure comprising:
a plurality of thin blades, wherein the plurality of thin blades have at least one cross-sectional thickness perpendicular to a surface of the blade smaller than 0.8 µm; and
a plurality of trenches separating the plurality of thin blades from one another, wherein the plurality of thin blades are separated from one another by a distance smaller than 0.8 µm, and wherein the plurality of trenches have a depth, in the substrate, greater than 100 µm.

22. The structure of claim 21, wherein the thickness of each thin blade is smaller than 0.1 µm.

23. The structure of claim 21, wherein the plurality of thin blades are separated from one another by a distance smaller than 0.1 µm.

24. The structure of claim 21, wherein a capacitor, a diode, a fuel cell, or a micro-battery is formed on surfaces of the plurality of thin blades.

25. The structure of claim 21, wherein a capacitor is formed on surfaces of the plurality of thin blades having a capacitance per unit area greater than 250 nF/mm2.

26. The structure of claim 21, wherein the Moore fractal curve comprises a Moore fractal curve of order 4.

27. The structure of claim 21, wherein a portion of the trench extends linearly and fully between two opposing walls.

\* \* \* \* \*